(12) United States Patent
Tsuji

(10) Patent No.: US 11,522,343 B2
(45) Date of Patent: Dec. 6, 2022

(54) SURFACE-EMITTING LASER AND METHOD OF MANUFACTURING THE SAME

(71) Applicant: SUMITOMO ELECTRIC INDUSTRIES, LTD., Osaka (JP)

(72) Inventor: Yukihiro Tsuji, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 331 days.

(21) Appl. No.: 16/891,154

(22) Filed: Jun. 3, 2020

(65) Prior Publication Data

US 2020/0412094 A1 Dec. 31, 2020

(30) Foreign Application Priority Data

Jun. 28, 2019 (JP) .............................. JP2019-121453

(51) Int. Cl.
| | |
|---|---|
| *H01S 5/183* | (2006.01) |
| *H01S 5/343* | (2006.01) |
| *H01S 5/028* | (2006.01) |
| *H01S 5/02* | (2006.01) |

(52) U.S. Cl.
CPC ........ *H01S 5/18352* (2013.01); *H01S 5/0217* (2013.01); *H01S 5/0282* (2013.01); *H01S 5/1835* (2013.01); *H01S 5/18313* (2013.01); *H01S 5/18347* (2013.01); *H01S 5/18361* (2013.01); *H01S 5/3432* (2013.01)

(58) Field of Classification Search
CPC .. H01S 5/18352; H01S 5/0217; H01S 5/0282; H01S 5/18313; H01S 5/18347; H01S 5/1835
See application file for complete search history.

(56) References Cited

U.S. PATENT DOCUMENTS

| | | | |
|---|---|---|---|
| 8,189,642 B1* | 5/2012 | Li ...................... | H01S 5/18352 |
| | | | 372/46.013 |
| 8,530,933 B2* | 9/2013 | Ogura ................... | H01L 31/109 |
| | | | 257/187 |
| 2018/0269655 A1* | 9/2018 | Koyama ................. | H01S 5/187 |
| 2020/0059070 A1* | 2/2020 | Hayakawa .............. | H01S 5/125 |

FOREIGN PATENT DOCUMENTS

| | | | | |
|---|---|---|---|---|
| JP | 2012033915 A | * | 2/2012 | ............ H01S 5/183 |
| WO | 2015/033649 A1 | | 3/2015 | |

OTHER PUBLICATIONS

Machine translation JP2012-33915 (Year: 2012).*

* cited by examiner

*Primary Examiner* — Yuanda Zhang
(74) *Attorney, Agent, or Firm* — Oliff PLC

(57) ABSTRACT

A surface-emitting laser includes a substrate; semiconductor layers provided on the substrate, the semiconductor layers including a lower reflector layer, an active layer, and an upper reflector layer, the semiconductor layers forming a mesa; a first insulating film covering the mesa; and a second insulating film covering the first insulating film, wherein the mesa has a polygonal shape in a direction in which the substrate extends, and a vertex of the mesa in the direction in which the substrate extends has a chamfered portion.

4 Claims, 13 Drawing Sheets

SURFACE-EMITTING LASER AND METHOD OF MANUFACTURING THE SAME

CROSS-REFERENCE TO RELATED APPLICATION

This application is based upon and claims the benefit of priority of the prior Japanese Patent Application No. 2019-121453, filed on Jun. 28, 2019, the entire contents of which are incorporated herein by reference.

BACKGROUND OF THE INVENTION

1. Field of the Invention

The present invention relates to a surface-emitting laser and a method of manufacturing the same.

2. Description of the Related Art

In International Publication No. WO 2015/033649, a vertical-cavity surface-emitting laser (VCSEL) is disclosed.

A chip-on-board system in which VCSEL chips are not packaged but are directly mounted on a board may be used. It is important here to increase the resistance of the VCSELs to moisture, dust, etc.

In order to protect a VCSEL chip from moisture and the like, the surface of the chip is covered with an insulating film (passivation film). However, moisture or the like may enter through a defect in the insulating film, and the chip may be corroded.

SUMMARY OF THE INVENTION

It is therefore an object of the present invention to provide a surface-emitting laser with improved moisture resistance and a method of manufacturing the same.

A surface-emitting laser according to an aspect of the present invention includes a substrate; semiconductor layers provided on the substrate, the semiconductor layers including a lower reflector layer, an active layer, and an upper reflector layer, the semiconductor layers forming a mesa; a first insulating film covering the mesa; and a second insulating film covering the first insulating film, wherein the mesa has a polygonal shape in a direction in which the substrate extends, and a vertex of the mesa in the direction in which the substrate extends has a chamfered portion.

A method of manufacturing a surface-emitting laser according to another aspect of the present invention includes the steps of stacking semiconductor layers including a lower reflector layer, an active layer, and an upper reflector layer on a substrate; forming, from the semiconductor layers, a mesa having a polygonal shape in a direction in which the substrate extends such that a chamfered portion is formed at a vertex of the mesa; forming a first insulating film covering the semiconductor layers after forming the mesa; removing a portion of the first insulating film outside the mesa; forming a second insulating film covering the first insulating film after removing the portion of the first insulating film outside the mesa; and providing a resist on the second insulating film and removing a portion of the second insulating film outside the first insulating film by etching using the resist to form an exposed portion of the substrate.

DESCRIPTION OF THE PREFERRED EMBODIMENTS

Description of Embodiments of the Invention

Figure 1A:
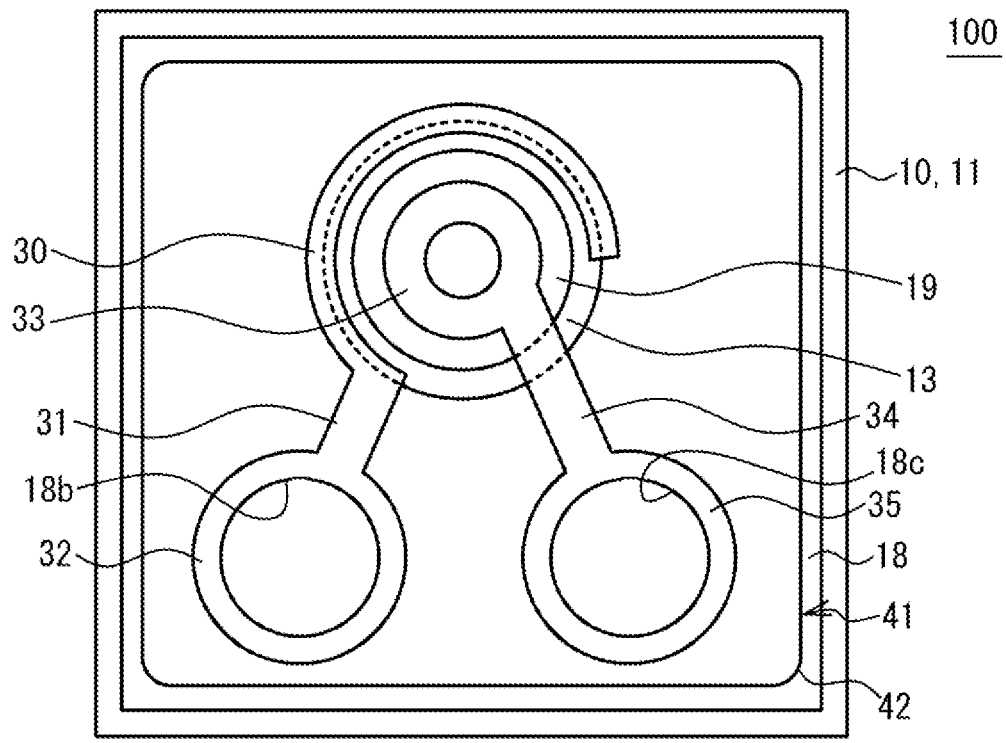
FIG. 1A is a plan view illustrating a surface-emitting laser according to a first embodiment.

First, embodiments of the present invention will be listed and described. (1) An embodiment of the present invention is a surface-emitting laser including a substrate; semiconductor layers provided on the substrate, the semiconductor layers including a lower reflector layer, an active layer, and an upper reflector layer, the semiconductor layers forming a mesa; a first insulating film covering the mesa; and a second insulating film covering the first insulating film, wherein the mesa has a polygonal shape in a direction in which the substrate extends, and a vertex of the mesa in the direction in which the substrate extends has a chamfered portion. The mesa is provided with a chamfered portion, which is covered by the first insulating film and is further covered by the second insulating film. Since the chamfered portion is provided in the mesa, the coverage of a resist is good, and a defect is less likely to occur in the second insulating film. Therefore, the moisture resistance is improved.

(2) The chamfered portion may be curved with a radius of curvature of 10 μm or more and 20 μm or less. Since the chamfered portion is provided, the coverage of a resist is good, and a defect is less likely to occur in the second insulating film. Therefore, the moisture resistance is improved.

(3) The first insulating film may have an end located between an end of the mesa and an end of the substrate, the second insulating film may cover the end of the first insulating film, and the second insulating film may have an end located between the end of the first insulating film and the end of the substrate. Since the first insulating film is not exposed, the moisture resistance is improved.

(4) The distance between the end of the mesa and the end of the first insulating film may be 2.5 µm or more, and the distance between the end of the first insulating film and the end of the second insulating film may be 1 µm or more. Since the second insulating film extends outside the end of the first insulating film and the first insulating film is not exposed, the moisture resistance is improved.

(5) The first insulating film may include silicon and oxygen, and the second insulating film may include silicon nitride. The dielectric constant of the first insulating film is low, and the parasitic capacitance is suppressed. Since the second insulating film is denser than the first insulating film, the moisture resistance is improved.

(6) A side surface of the mesa may be inclined with respect to the stacking direction of the semiconductor layers. The moisture resistance is improved by covering the inclined side surface of the mesa with the second insulating film.

(7) Another embodiment of the present invention is a method of manufacturing a surface-emitting laser. The method includes the steps of stacking semiconductor layers including a lower reflector layer, an active layer, and an upper reflector layer on a substrate; forming, from the semiconductor layers, a mesa having a polygonal shape in a direction in which the substrate extends such that a chamfered portion is formed at a vertex of the mesa; forming a first insulating film covering the semiconductor layers after forming the mesa; removing a portion of the first insulating film outside the mesa; forming a second insulating film covering the first insulating film after removing the portion of the first insulating film outside the mesa; and providing a resist on the second insulating film and removing a portion of the second insulating film outside the first insulating film by etching using the resist to form an exposed portion of the substrate. Since the chamfered portion is provided, the coverage of the resist is good, and a defect is less likely to occur in the second insulating film. Therefore, the moisture resistance is improved.

(8) The method may further include the step of, after forming the exposed portion of the substrate, cutting the substrate at the exposed portion. Since the substrate is cut at the portion exposed from the second insulating film, the second insulating film is less likely to peel off, and the moisture resistance is improved.

Details of Embodiments of the Invention

Specific examples of a surface-emitting laser and a method of manufacturing the surface-emitting laser according to an embodiment of the present invention will be described below with reference to the drawings. It should be noted that the present invention is not limited to these examples, but is indicated by the claims, and it is intended to include all modifications within the meaning and range of equivalency of the claims.

First Embodiment

Surface-Emitting Laser

Figure 1B:
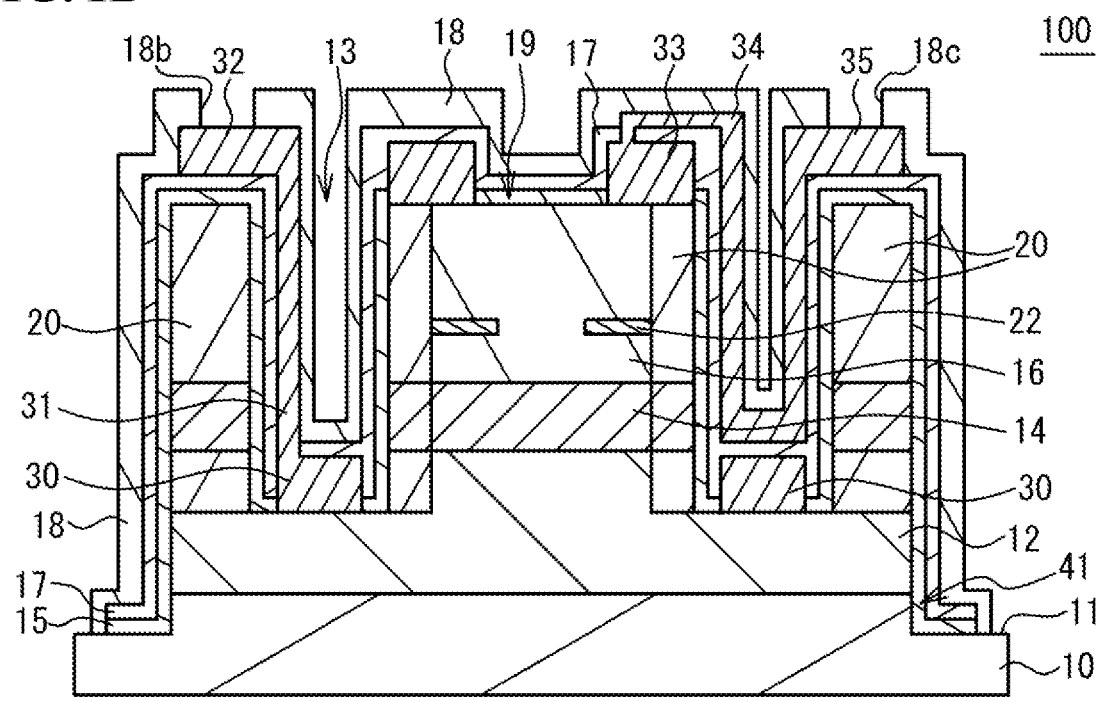
FIG. 1B is a cross-sectional view illustrating the surface-emitting laser.

FIG. 1A is a plan view illustrating a surface-emitting laser 100 according to a first embodiment, and FIG. 1B is a cross-sectional view illustrating the surface-emitting laser 100.

As shown in FIG. 1A, the surface-emitting laser 100 has a rectangular VCSEL with a side length of 200 µm to 300 µm, for example. The surface-emitting laser 100 is manufactured by forming a plurality of surface-emitting lasers 100 on a single substrate and cutting the substrate along grooves provided between the surface-emitting lasers 100. Therefore, a groove 11 for element isolation is provided in the outer peripheral portion of the surface-emitting laser 100. In the groove 11, a substrate 10 is exposed. Semiconductor layers, such as a lower reflector layer 12, an active layer 14, and an upper reflector layer 16, which will be described later, are located on the substrate 10 and form a mesa 41. The mesa 41 is formed to provide the groove 11 for element (surface-emitting laser 100) separation. The mesa 41 is surrounded by the groove 11 and has a rectangular shape in the direction in which the substrate 10 extends. Each of the vertices of the rectangular shape of the mesa 41 has a chamfered portion 42. A mesa 19 and pads 32 and 35 are located inside the mesa 41 and are surrounded by the groove 11. The mesa 19 is for forming a light-emitting portion of the surface-emitting laser 100. A groove 13 is provided around the mesa 19. An electrode 33 is provided on the mesa 19. The electrode 33 is electrically connected to the pad 35 by a wiring line 34. An electrode 30 is provided in the groove 13. The electrode 30 is electrically connected to the pad 32 by a wiring line 31.

As shown in FIG. 1B, the surface-emitting laser 100 includes a substrate 10, a lower reflector (Distributed Bragg Reflector: DBR) layer 12, an active layer 14, and an upper reflector layer 16.

The substrate 10 is, for example, a semi-insulating gallium arsenide (GaAs) semiconductor substrate. The lower reflector layer 12, the active layer 14, and the upper reflector layer 16 are sequentially stacked on the substrate 10, and these semiconductor layers form the mesas 19 and 41.

The lower reflector layer 12 is, for example, a semiconductor multilayered film in which n-type aluminum gallium arsenide ($Al_xGa_{1-x}As$, where $0 \leq x \leq 0.3$, and $Al_yGa_{1-y}As$, where $0.7 \leq y \leq 1$) layers having different compositions are alternately stacked, each with an optical thickness of $\lambda/4$. $\lambda$ is the wavelength of light emitted from the active layer 14. The lower reflector layer 12 is doped with, for example, silicon (Si). The lower reflector layer 12 also includes a conductive contact layer in contact with the electrode 30, the contact layer being formed of, for example, AlGaAs or GaAs.

The active layer 14 is formed of, for example, GaAs and indium gallium arsenide (InGaAs), has a multiple quantum well (MQW) structure in which quantum well layers and barrier layers are alternately stacked, and has an optical gain. Cladding layers (not shown) are interposed between the active layer 14 and the lower reflector layer 12 and between the active layer and the upper reflector layer 16.

The upper reflector layer 16 is, for example, a semiconductor multilayered film in which p-type $Al_xGa_{1-x}As$ ($0 \leq x \leq 0.3$) and $Al_yGa_{1-y}As$ ($0.7 \leq y \leq 1$) layers are alternately stacked, each with an optical thickness of $\lambda/4$. The upper reflector layer 16 is doped with carbon (C), for example. The upper reflector layer 16 includes a conductive contact layer in contact with the electrode 33, and the contact layer is formed of, for example, AlGaAs or GaAs.

The substrate 10, the lower reflector layer 12, the active layer 14, and the upper reflector layer 16 may be formed of other compound semiconductors. For example, in addition to GaAs, the substrate 10 may be formed of another compound semiconductor including Ga and As, such as $Al_xGa_{1-x}As$ ($0 \leq x \leq 0.2$).

An oxide confinement layer 22 is formed by selectively oxidizing a part of the upper reflector layer 16. The oxide confinement layer 22 is formed at the periphery of the upper reflector layer 16 of the mesa 19, and is not formed at the center of the upper reflector layer 16. The oxide confinement layer 22 includes, for example, aluminum oxide ($Al_2O_3$) and is insulating, and less current flows through the oxide confinement layer 22 than through the portion that is not oxidized. Therefore, the unoxidized portion on the center side of the upper reflector layer 16 becomes a current path, and efficient current injection becomes possible.

A high-resistance region 20 is formed on the outer side of the oxide confinement layer 22 in the peripheral portion of the mesa 19. The high-resistance region 20 is formed by implanting ions such as protons, for example. The high-resistance region 20 is also formed in the mesa 41. The high-resistance region 20 is a region constituting parts of the upper reflector layer 16, the active layer 14, and the lower reflector layer 12 of the surface-emitting laser 100, and is a region in which parts of these layers have a high resistance. The groove 13 extends through the high-resistance region 20 in the thickness direction, reaches the lower reflector layer 12, and surrounds the mesa 19. The groove 11 is located outside the groove 13 and the high-resistance region 20, surrounds them, and reaches the substrate 10 in the thickness direction. The semiconductor layers form the mesa 41 inside the groove 11.

An insulating film 15 (first insulating film, interlayer film) is formed of, for example, 200 nm-thick silicon oxynitride (SiON) or silicon oxide ($SiO_2$), and covers the surface of the high-resistance region 20 and the surface of the mesa 19. An insulating film 17 (first insulating film, interlayer film) is formed of, for example, 200 nm-thick SiON or $SiO_2$, and covers the insulating film 15. In order to reduce the parasitic capacitance, the dielectric constants of the insulating films 15 and 17 are preferably low. The insulating films 15 and 17 function as reflective films for reflecting light emitted from the active layer 14, and the thickness and the refractive index are determined so as to increase the reflectance. An insulating film 18 (second insulating film, passivation film) is formed of, for example, silicon nitride (SiN) having a thickness of 100 nm, and covers the insulating film 17. The insulating film 18 is, for example, a passivation film denser than the insulating films 15 and 17, and protects the surface-emitting laser 100, for example, from moisture and dust. The insulating film 18 has an opening 18b through which the pad 32 is exposed and an opening 18c through which the pad 35 is exposed.

The electrode 30 is, for example, an n-type electrode having a stacked structure of gold-germanium (AuGe) and nickel (Ni), and is provided on the surface of the lower reflector layer 12 inside the groove 13. The electrode 33 is, for example, a p-type electrode having a stacked structure of titanium (Ti), platinum (Pt), and Au, and is provided on the surface of the upper reflector layer 16 on the top of the mesa 19. The electrodes 30 and 33 are ohmic electrodes. The pads 32 and 35 are located outside the mesa 19 above the high-resistance region 20. The wiring line 31 and the pad 32 are electrically connected to the electrode 30 and the lower reflector layer 12 through an opening of the insulating film 17. The wiring line 34 and the pad 35 are electrically connected to the electrode 33 and the upper reflector layer 16.

Figure 2A:
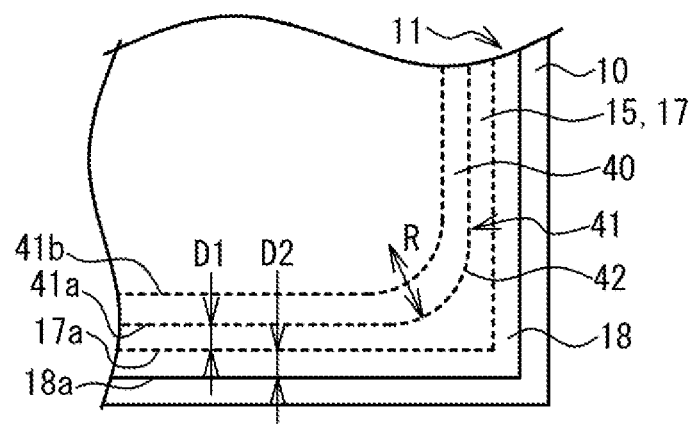
FIG. 2A is an enlarged plan view of the vicinity of a groove.
Figure 2B:
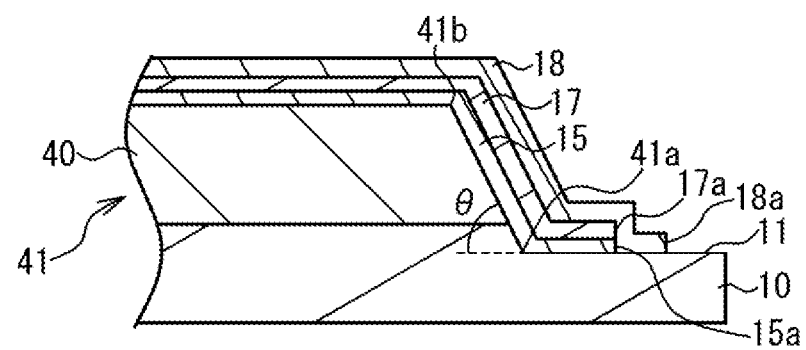
FIG. 2B is an enlarged cross-sectional view of the vicinity of the groove.

FIG. 2A is an enlarged plan view of the vicinity of the groove 11, and FIG. 2B is an enlarged cross-sectional view of the vicinity of the groove 11. A semiconductor stack 40 shown in these figures includes, for example, the lower reflector layer 12, the active layer 14, the upper reflector layer 16, and the high-resistance region 20.

As shown in FIGS. 2A and 2B, the mesa 41 is formed on the substrate 10 inside the groove 11. As shown in FIG. 2B, the semiconductor stack 40 is inclined with respect to the stacking direction, and the angle θ between the semiconductor stack 40 and the surface of the substrate 10 is, for example, 60° or more and 80° or less. The lower end of the mesa 41 is referred to as "lower end 41a", and the upper end thereof is referred to as "upper end 41b". The chamfered portion 42 is formed at each of the vertices of the mesa 41. The radius of curvature R of the chamfered portion 42 (lower end 41a) is, for example, 10 μm or more and 20 μm or less. The insulating films 15 and 17 cover the lower end 41a and the chamfered portions 42 of the mesa 41. As shown in FIG. 2A, the vertices of the insulating films 15, 17, and 18 form a right angle, for example.

An end 15a of the insulating film 15 and an end 17a of the insulating film 17 are located on the substrate 10 in the groove 11, and are located between the lower end 41a and the end of the substrate 10. The insulating film 18 covers the surface of the insulating film 17, the end 15a, and the end 17a. The end 18a of the insulating film 18 is located on the substrate 10 between the ends 15a and 17a and the end of the substrate 10. A part of the substrate 10 is exposed from the insulating film 18. Steps are formed at the lower end 41a and the ends 15a and 17a, and the insulating film 18 follows the steps. The distance D1 between the lower end 41a and the end 17a of the insulating film 17 shown in FIG. 2A is, for example, 2.5 μm or more. The distance D2 between the ends 18a and 17a is, for example, 1 μm or more.

Manufacturing Method

Next, a method of manufacturing the surface-emitting laser 100 will be described. FIGS. 3A to 7B are cross-sectional views illustrating the method of manufacturing the surface-emitting laser 100. FIGS. 8A to 9C are enlarged plan views of the vicinity of the groove 11. FIGS. 10A to 12C are enlarged cross-sectional views of the vicinity of the groove 11. FIGS. 8A, 8B, 10A, and 10B correspond to the step of forming the mesa 41 in FIG. 5A. FIGS. 9A, 11A, 11B, and 11C correspond to the etching of the insulating films 15 and 17 in FIG. 6B. FIG. 9B, FIG. 9C, and FIGS. 11D to 12C correspond to the etching of the insulating film 18 in FIG. 7B. In FIGS. 3A to 12C, a portion, corresponding to one surface-emitting laser 100, of a substrate on which a plurality of surface-emitting lasers 100 are manufactured is illustrated.

Figure 3A:
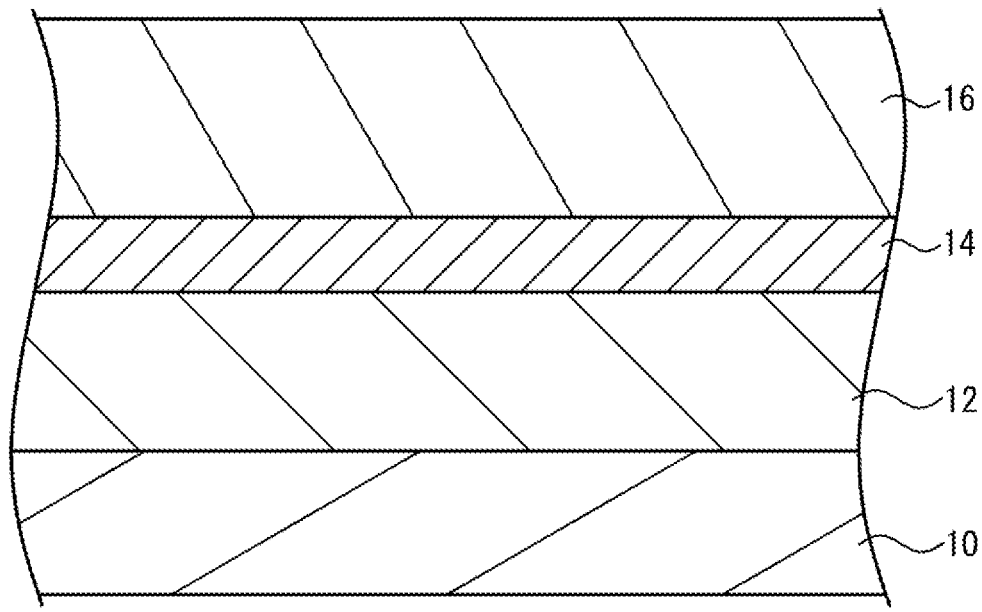
FIGS. 3A and 3B are cross-sectional views illustrating a method of manufacturing the surface-emitting laser.

As shown in FIG. 3A, the lower reflector layer 12, the active layer 14, and the upper reflector layer 16 are epitaxially grown in this order on the substrate 10 by, for example, a metal-organic vapor phase epitaxy (MOVPE) method or a molecular beam epitaxy (MBE) method. The upper reflector layer 16 includes an $Al_xGa_{1-x}As$ layer (0.9≤x≤1.0) for forming the oxide confinement layer 22.

Figure 3B:
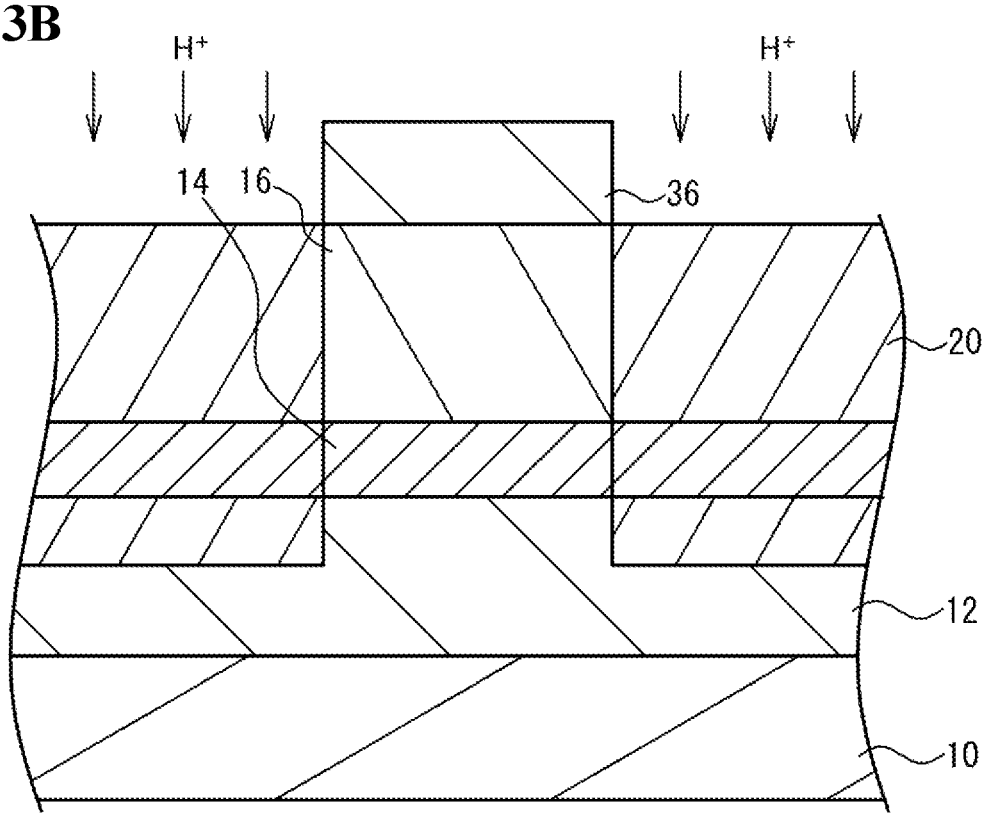

As shown in FIG. 3B, after resist patterning of a photoresist 36, ion implantation is performed to form the high-resistance region 20. Specifically, for example, a photoresist 36 having a thickness of 10 μm or more and 15 μm or less is applied by spin coating. A portion of the photoresist 36 is covered with a mask, and an exposure device is used to irradiate the photoresist 36 with, for example, ultraviolet (UV) light having a wavelength of 365 nm. The exposed portion of the photoresist 36 is dissolved in an alkaline solution such as tetramethylammonium hydroxide (TMAH) to leave the masked portion of the photoresist 36. For example, ions such as protons (W) are implanted to form the high-resistance region 20.

The portion of the wafer covered with the photoresist 36 is not implanted with protons, and the portion exposed from the photoresist 36 is implanted with protons. The implantation depth is, for example, 5 μm. After the ion implantation, the photoresist 36 is removed with an organic solvent and by ashing with an oxygen plasma or the like.

Figure 4A:
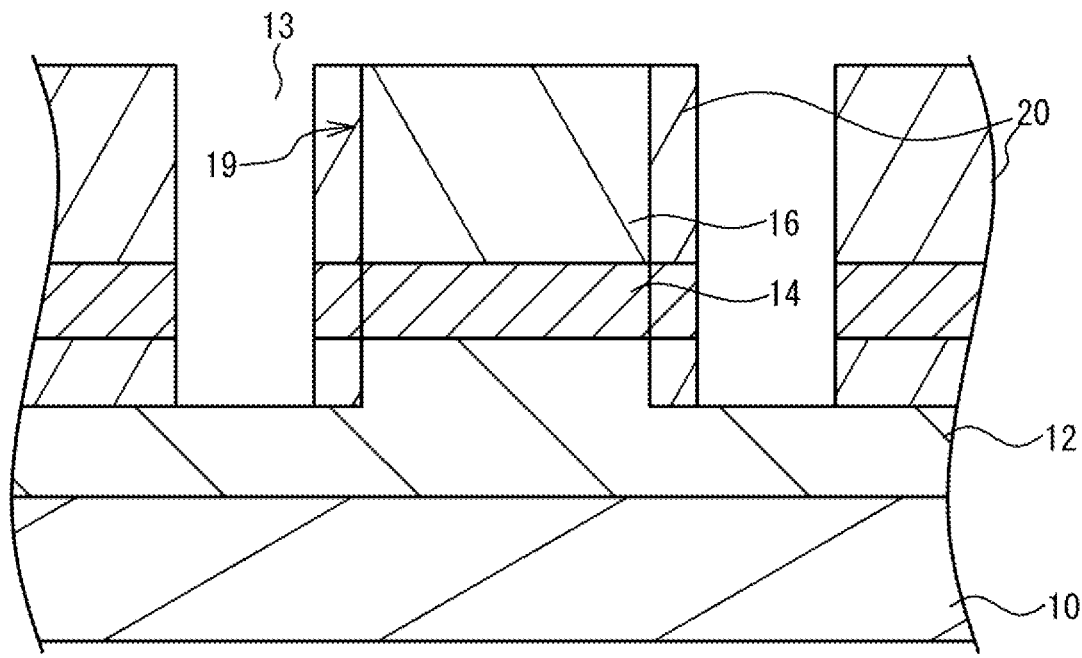
FIGS. 4A and 4B are cross-sectional views illustrating the method of manufacturing the surface-emitting laser.

As shown in FIG. 4A, the mesa 19 is formed by dry etching of the high-resistance region 20 using, for example, an inductively-coupled-plasma reactive ion etching (ICP-RIE) device. At this time, the groove 13 reaching the lower reflector layer 12 is formed in the high-resistance region 20, and the portion which is not to be etched is protected by a photoresist (not shown). As the etching gas, for example, a $BCl_3$ gas or a mixed gas of $BCl_3$ and $Cl_2$ is used. Examples of etching conditions are shown below:

$BCl_3$/Ar=30 sccm/70 sccm (or $BCl_3$/$Cl_2$/Ar=20 sccm/10 sccm/70 sccm)

ICP power: 50 W to 1,000 W

Bias power: 50 W to 500 W

Wafer temperature: 25° C. or less

Figure 4B:
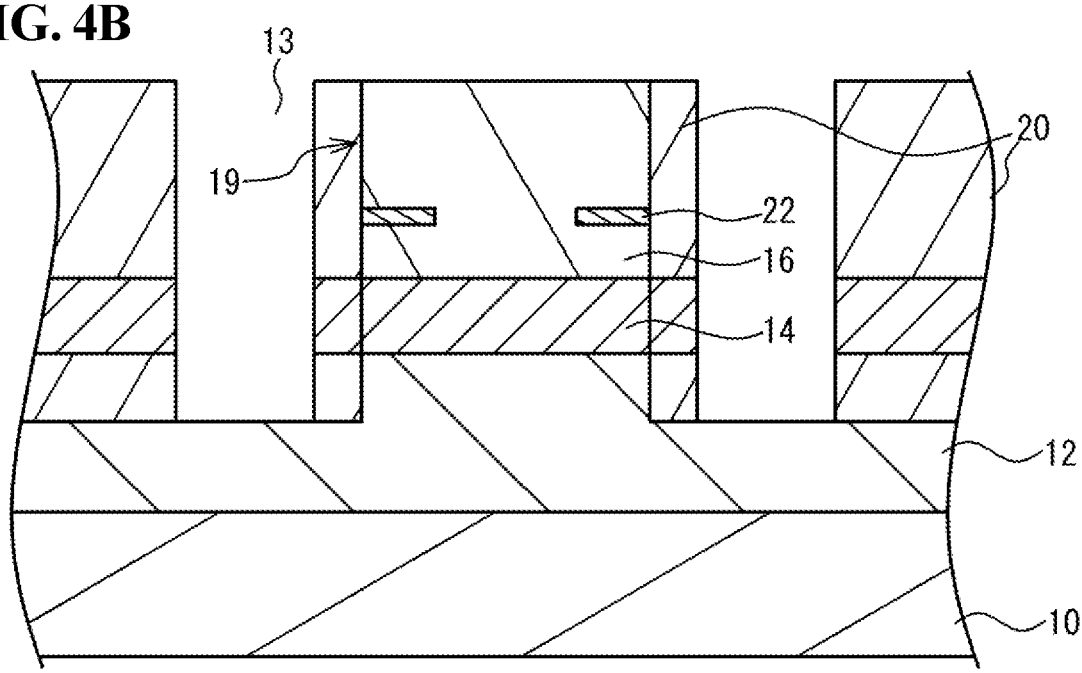

As shown in FIG. 4B, a portion of the upper reflector layer 16 is oxidized from the end by heating it to about 400° C. in a steam atmosphere, for example, to form the oxide confinement layer 22. The heating time is determined so that the oxide confinement layer 22 reaches a predetermined width and an unoxidized portion having a predetermined width remains inside the oxide confinement layer 22.

Figure 5A:
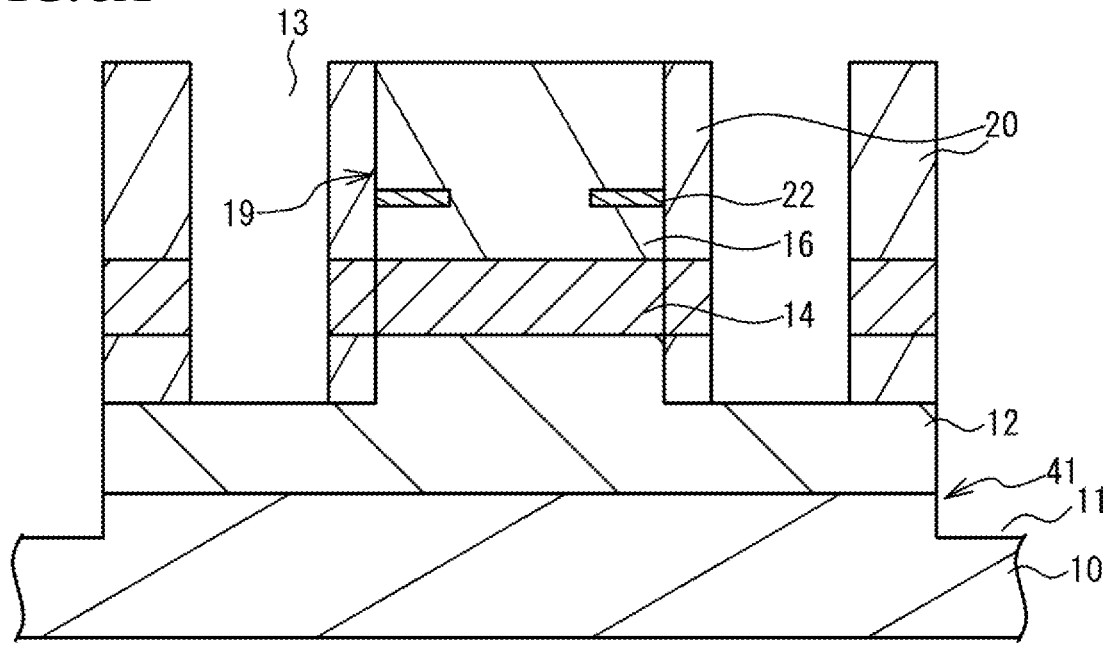
FIGS. 5A and 5B are cross-sectional views illustrating the method of manufacturing the surface-emitting laser.

As shown in FIG. 5A, the groove 11 and the mesa 41 are formed by dry-etching the high-resistance region 20, the lower reflector layer 12, and a portion of the substrate 10. At this time, the portions that are not to be etched, such as the mesa 19 and the groove 13, are covered with a photoresist (not shown). As the etching gas, for example, a $BCl_3$ gas or a mixed gas of $BCl_3$ and $Cl_2$ is used. Examples of etching conditions are shown below:

$BCl_3$/Ar=30 sccm/70 sccm (or $BCl_3$/$Cl_2$/Ar=20 sccm/10 sccm/70 sccm)

ICP power: 50 W to 1,000 W

Bias power: 50 W to 1,000 W

Wafer temperature: 25° C. or less

Figure 8A:
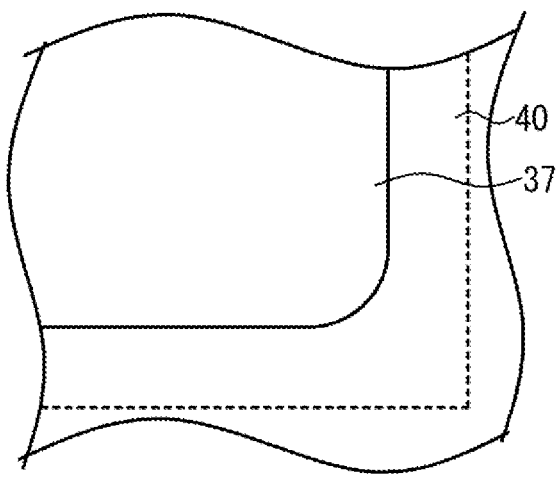
FIGS. 8A and 8B are enlarged plan views of the vicinity of the groove.
Figure 10A:
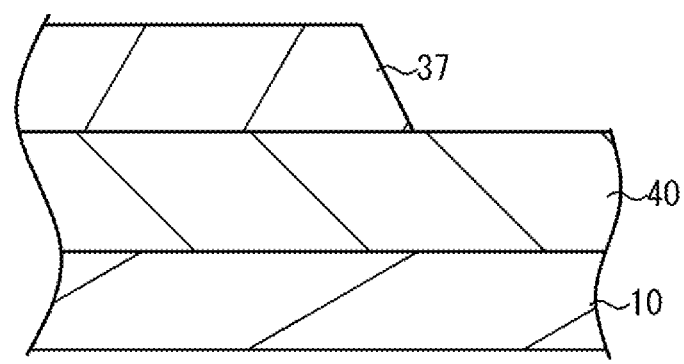
FIGS. 10A and 10B are enlarged cross-sectional views of the vicinity of the groove.

More particularly, as shown in FIGS. 8A and 10A, for example, a photoresist 37 having a thickness of 6 μm is applied on the semiconductor stack 40, and exposure and development are performed such that each vertex has a chamfered shape as shown in FIG. 8A. For example, post-baking is performed at 100° C. for 1 minute. The photoresist 37 shrinks after the post-baking. Since the chamfered portion shrinks uniformly, the shape of the chamfered portion remains even after the shrinkage. Further, since the photoresist 37 shrinks to a greater extent toward the upper side, it becomes tapered as shown in FIG. 10A. The angle between the side surface of the photoresist 37 and the surface of the substrate 10 is, for example, 60° to 80°.

Figure 8B:
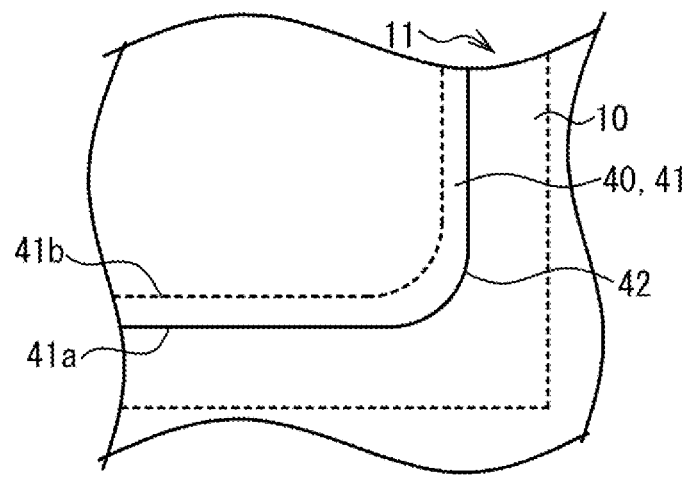
Figure 10B:
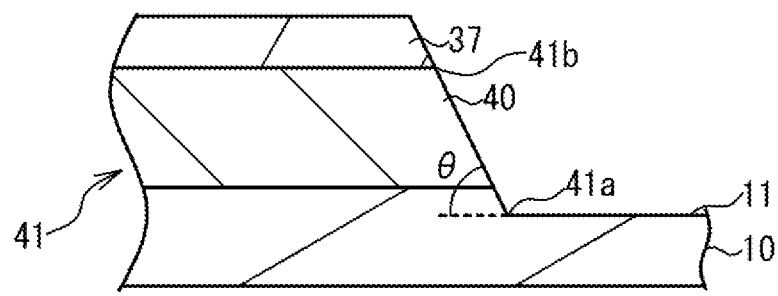

Using the post-baked photoresist 37 as a resist mask, reactive ion etching is performed on the semiconductor stack 40 and the substrate 10 under the above-described conditions to form the groove 11 and the mesa 41 as shown in FIG. 8B and FIG. 10B. The etching selectivity ratio of the photoresist 37 to the semiconductor stack 40 is, for example, about 1:3. The photoresist 37 is etched by, for example, 2 μm on the upper surface side and 3.5 μm on the side surface side, and the shape of the photoresist 37 is transferred to the semiconductor stack 40 and the substrate 10. As a result, the chamfered portion 42 is formed at each vertex of the mesa 41 as shown in FIG. 8B, and the mesa 41 is inclined at the angle θ. After etching, the photoresist 37 is removed.

The depth of the groove 11 is, for example, 7 μm, and the substrate 10 is exposed in the groove 11. Since the lower reflector layer 12, the active layer 14, and the upper reflector layer 16 are separated between the plurality of surface-emitting lasers 100, the plurality of surface-emitting lasers 100 are electrically separated. The distance between adjacent surface-emitting lasers 100 is, for example, 30 μm to 60 μm.

Figure 5B:
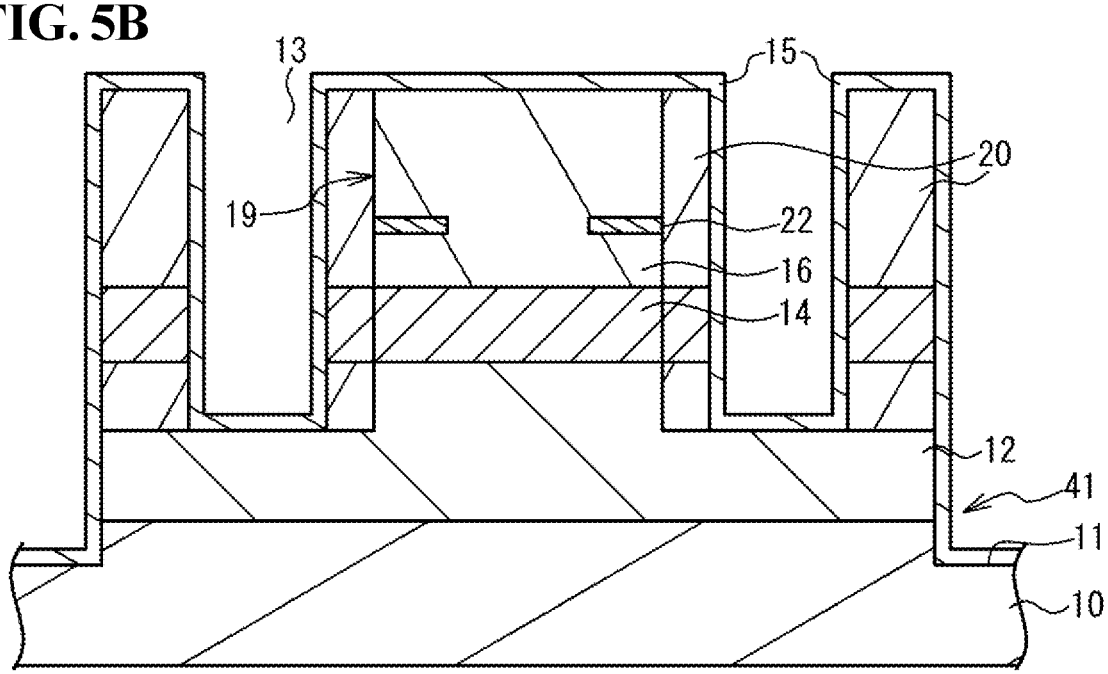

As shown in FIG. 5B, the insulating film 15 covering the wafer is formed by, for example, plasma-CVD. The insulating film 15 is, for example, a SiON film or a $SiO_2$ film.

Figure 6A:
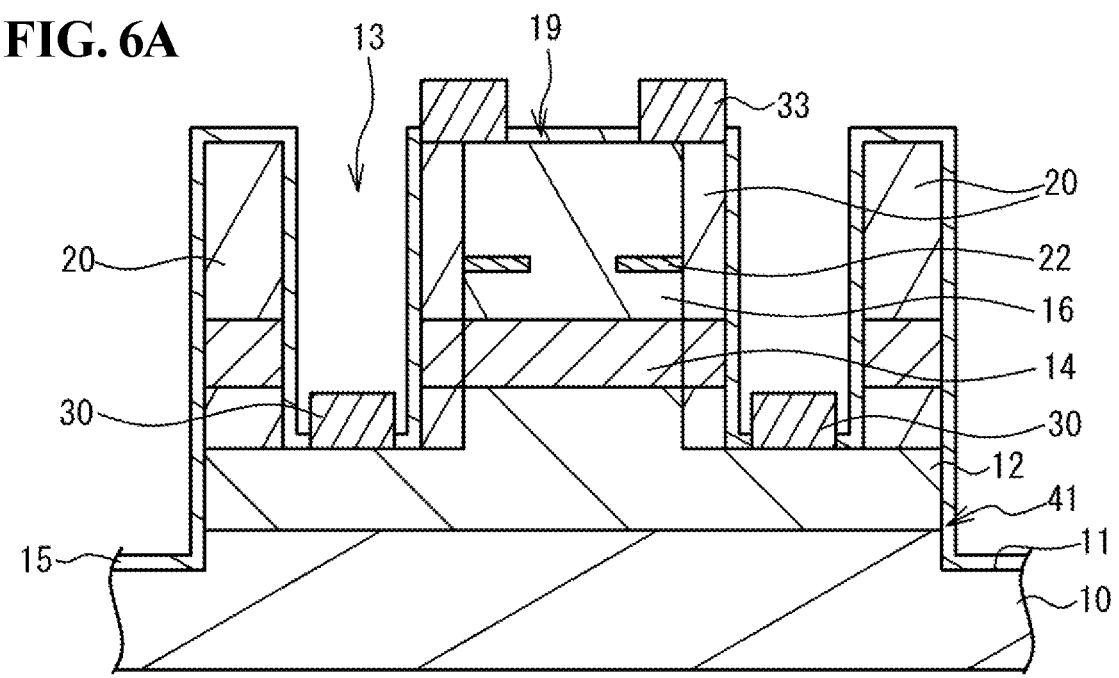
FIGS. 6A and 6B are cross-sectional views illustrating the method of manufacturing the surface-emitting laser.

As shown in FIG. 6A, openings are formed in parts of the insulating film 15, the electrode 30 is formed on the surface of the lower reflector layer 12 by resist patterning and vacuum evaporation, and the electrode 33 is formed on the surface of the upper reflector layer 16. After the electrodes 30 and 33 are formed, heat treatment is performed at a temperature of, e.g., about 400° C. for 1 minute, whereby ohmic contacts are made between the electrodes 30 and 33 and the semiconductor. The electrode 30 is electrically connected to the lower reflector layer 12, and the electrode 33 is electrically connected to the upper reflector layer 16.

Figure 6B:
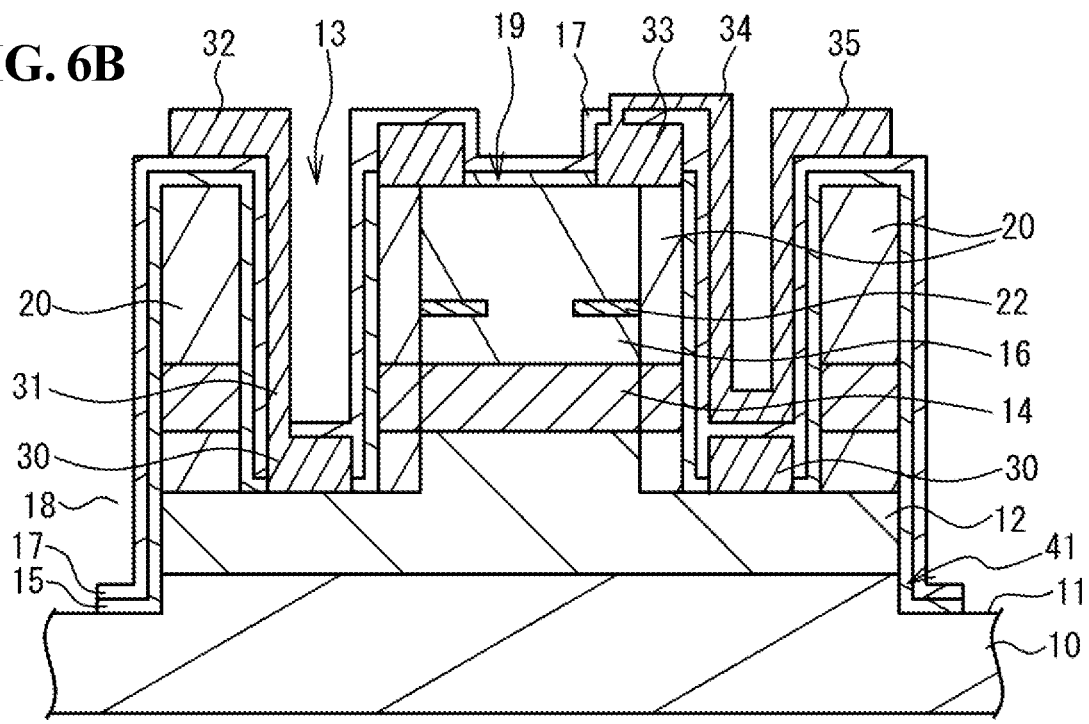

As shown in FIG. 6B, the insulating film 17 is formed on the insulating film 15 and the electrodes 30 and 33 by, for example, plasma-CVD. The insulating film 17 is, for example, a SiON film or a $SiO_2$ film. The insulating film 17 is etched using a resist pattern, whereby an opening through which the electrode 30 is exposed and an opening through which the electrode 33 is exposed are formed in the insulating film 17. The wiring line 31 and the pad 32 connected to the electrode 30 and the wiring line 34 and the pad 35 connected to the electrode 33 are formed by plating or the like.

Figure 11A:
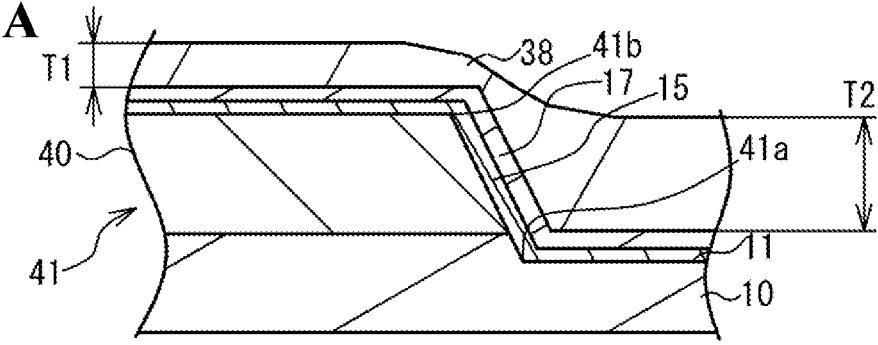
FIGS. 11A to 11D are enlarged cross-sectional views of the vicinity of the groove.
Figure 11B:
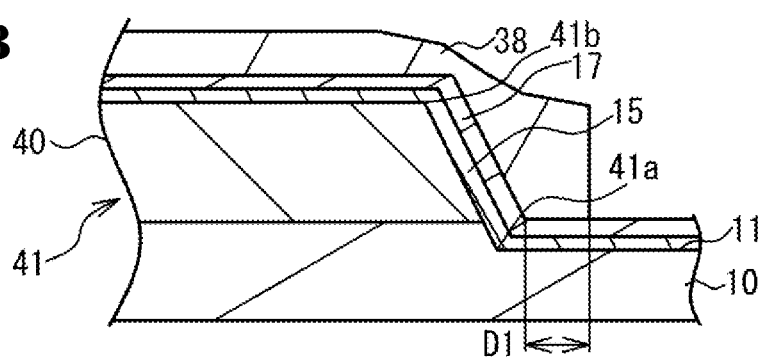
Figure 11C:
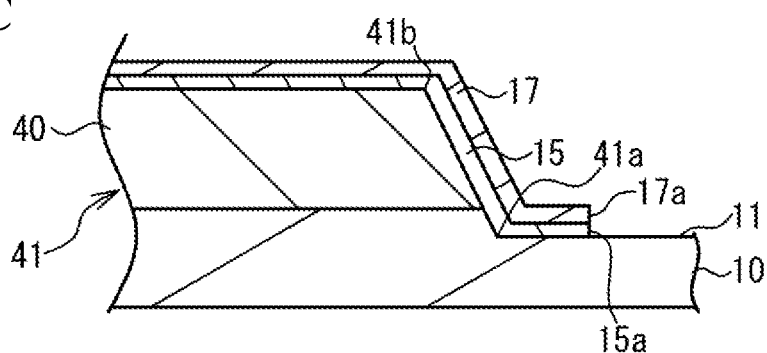

As shown in FIG. 11A, specifically, a photoresist 38 is applied on the insulating films 15 and 17 by spin coating. The thickness T1 of the photoresist 38 on the top of the mesa 41 is, for example, 2 μm, and the thickness T2 of the photoresist 38 outside the lower end 41a of the mesa 41 is, for example, 6 μm. As shown in FIG. 11B, a portion of the photoresist 38 is removed by exposure and development. A portion of the photoresist 38 which is separated from the lower end 41a of the mesa 41 by the distance D1 or more, for example, 2.5 μm or more, is removed to expose the insulating film 17. Using the photoresist 38 as a resist mask, the insulating films 17 and 15 are etched with buffered hydrofluoric acid or the like to remove the portion exposed from the photoresist 38, thereby exposing the substrate 10. As a result, the end 15a of the insulating film 15 and the end 17a of the insulating film 17 are exposed. The photoresist 38 is removed after the etching, as shown in FIG. 9A and FIG. 11C.

Figure 9A:
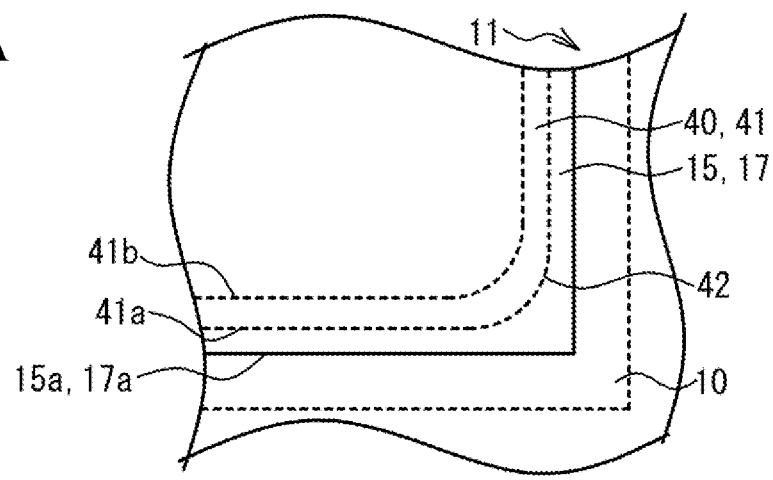
FIGS. 9A to 9C are enlarged plan views of the vicinity of the groove.

As shown in FIG. 9A, the vertices of the mesa 41 do not form a sharp corner, and the chamfered portions 42 are provided. Therefore, the coverage of the photoresist 38 is good, and the adhesion of the photoresist 38 to the insulating film 17 is increased. As a result, the occurrence of defects in the insulating film 15 and the insulating film 17 can be suppressed.

When a portion of the photoresist 38 which is separated from the lower end 41a of the mesa 41 by a distance of less than 2.5 μm, for example, 1 μm, is removed, light may diffract during exposure and cause a defect in the photoresist 38. If there is a defect in the photoresist 38, side etching of the insulating films 15 and 17 proceeds, and defects are formed in the insulating film 15 and the insulating film 17. As a result, the semiconductor stack 40 is exposed, and the moisture resistance is lowered.

Figure 7A:
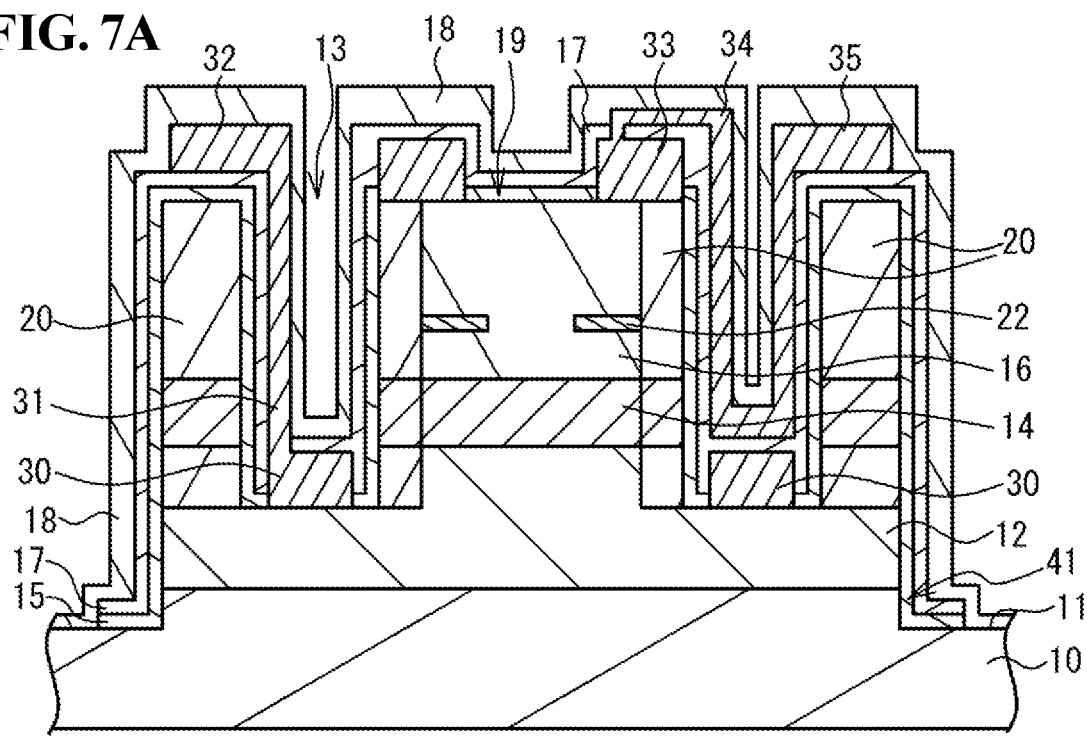
FIGS. 7A and 7B are cross-sectional views illustrating the method of manufacturing the surface-emitting laser.
Figure 7B:
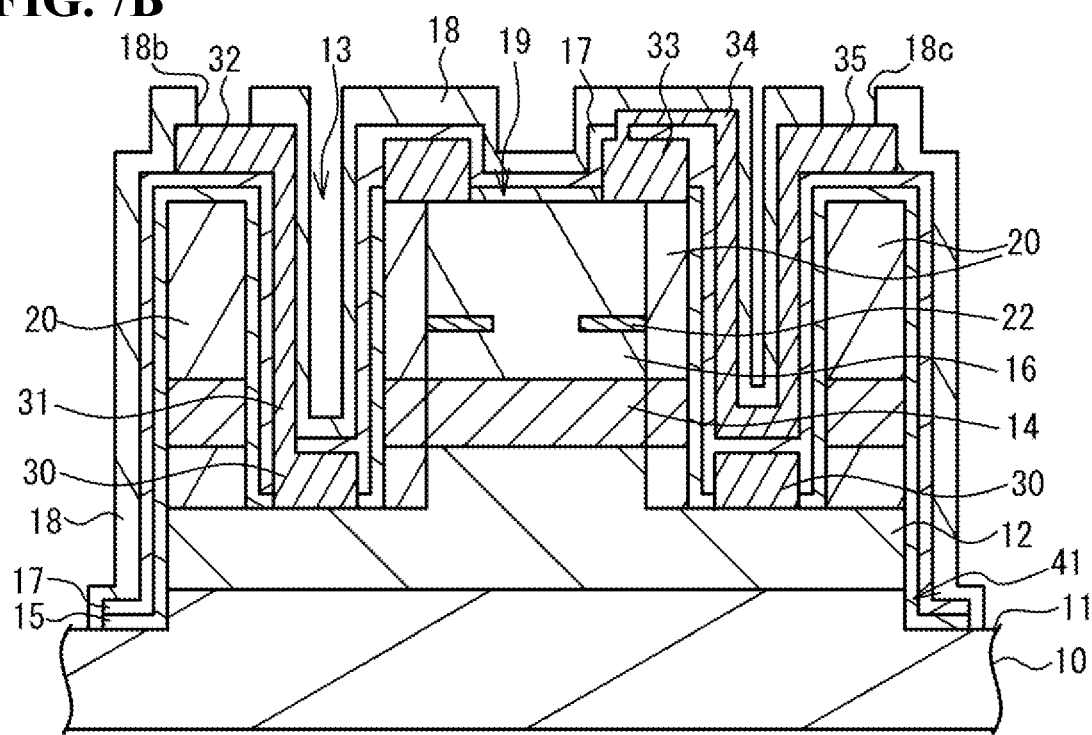
Figure 11D:
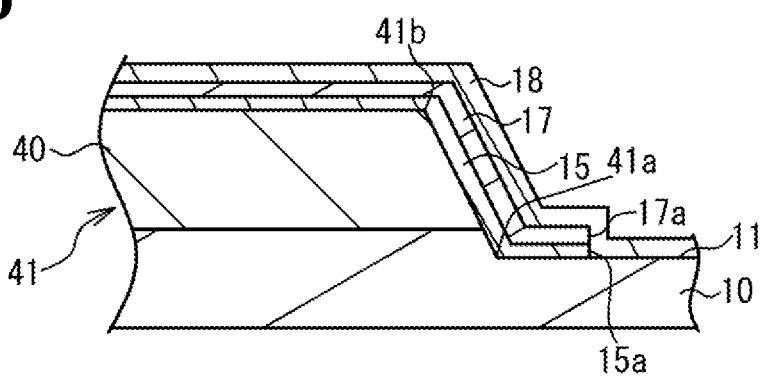

As shown in FIG. 7A and FIG. 11D, the insulating film 18 is provided by, for example, a plasma-CVD method. The insulating film 18 is a passivation film formed of an insulator such as SiN, for example, and covers the insulating film 17, the wiring lines 31 and 34, and the pads 32 and 35. As shown in FIG. 7B, parts of the insulating film 18 are etched to provide the openings 18b and 18c, thereby exposing the pads 32 and 35. The portion of the insulating film 18 in the groove 11 is also etched to expose the substrate 10 in the groove 11.

Figure 9B:
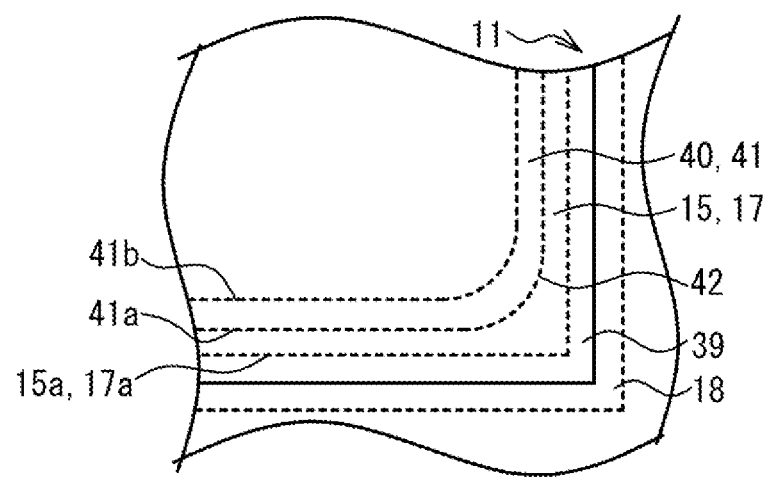
Figure 9C:
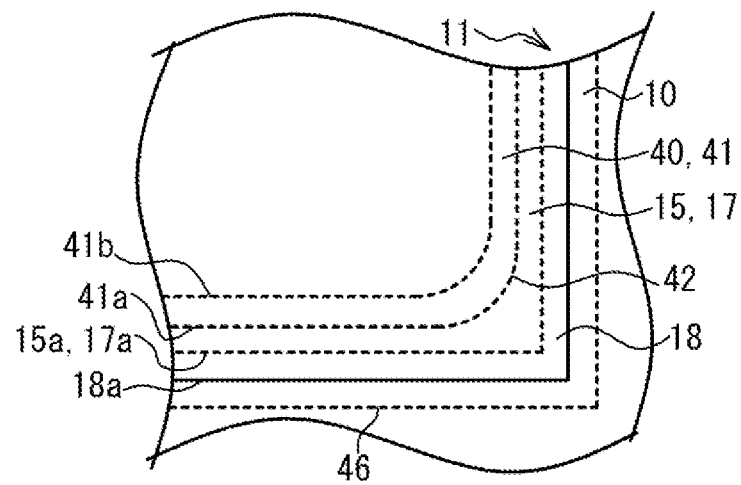
Figure 12A:
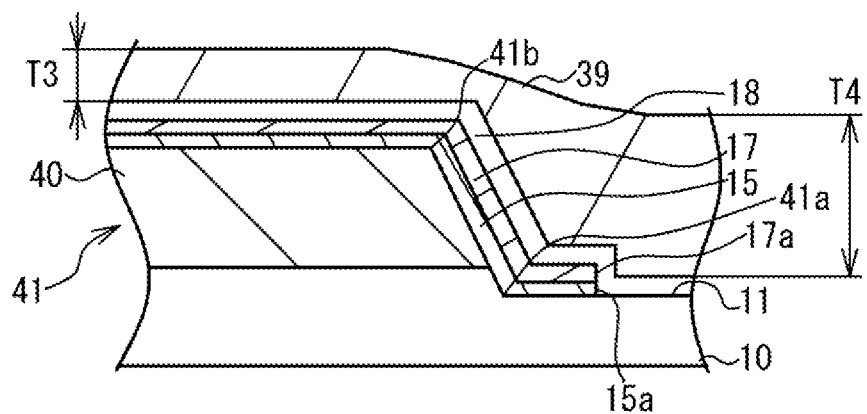
FIGS. 12A to 12C are enlarged cross-sectional views of the vicinity of the groove.
Figure 12B:
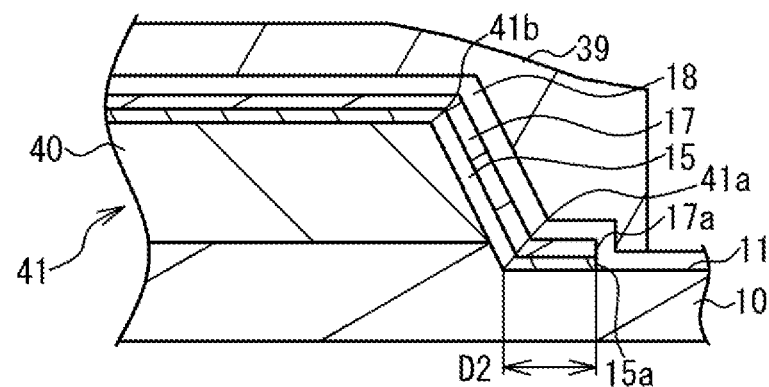
Figure 12C:
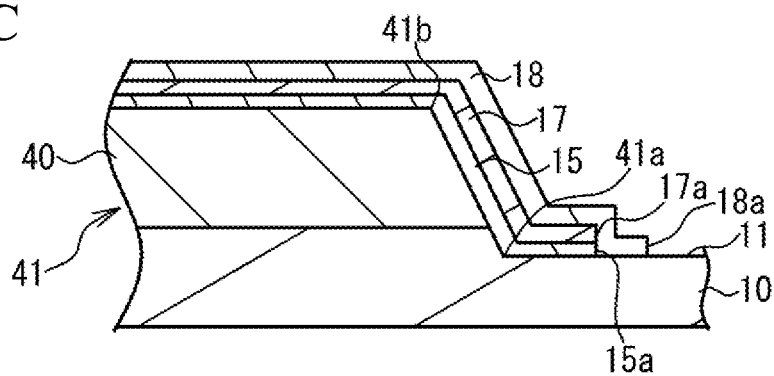

More specifically, as shown in FIG. 12A, a photoresist 39 is applied by spin coating. The thickness T3 of the photoresist 39 on the top of the mesa 41 is, for example, 2 µm, and the thickness T4 of the photoresist 39 on the outside of the lower end 41a of the mesa 41 is, for example, 6 µm. As shown in FIG. 9B and FIG. 12B, exposure and development are performed to remove a portion of the photoresist 39 which is separated from the lower end 41a of the mesa 41 by the distance D2 (e.g., 3.5 µm or more) to expose the insulating film 18. As shown in FIG. 9C and FIG. 12C, the insulating film 18 is etched with, for example, buffered hydrofluoric acid using the photoresist 39 as a resist mask to form an exposed portion of the substrate 10.

As shown in FIG. 9B, since the vertices of the mesa 41 do not have a sharp corner and the chamfered portions 42 are provided, the coverage of the photoresist 39 is good, and the adhesion of the photoresist 39 to the insulating film 18 is increased. As a result, as shown in FIG. 12B, the region from above the mesa 41 to the outside of the ends 15a and 17a can be covered with the photoresist 39, and side etching of the insulating film 18 can be suppressed. The photoresist 39 is removed after the etching, as shown in FIG. 9C and FIG. 12C.

The back surface of the substrate 10 is polished by using a tool such as a back grinder or a lapping apparatus to a thickness of about 100 µm to 200 µm. Using a blade or the like, the substrate 10 is cut along a scribe line 46 in FIG. 9C in the groove 11 to form a chip of the surface-emitting laser 100. The exposed portion of the substrate 10 is cut with a blade. There is no insulating film on the exposed portion. Since the blade does not contact the insulating films 15, 17 and 18, these films are less likely to peel off.

Comparative Example

Figure 13A:
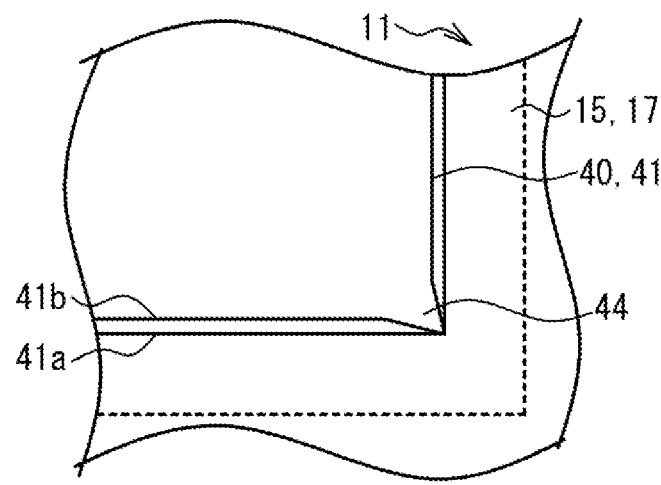
FIGS. 13A and 13B are enlarged plan views of the vicinity of the groove.
Figure 13B:
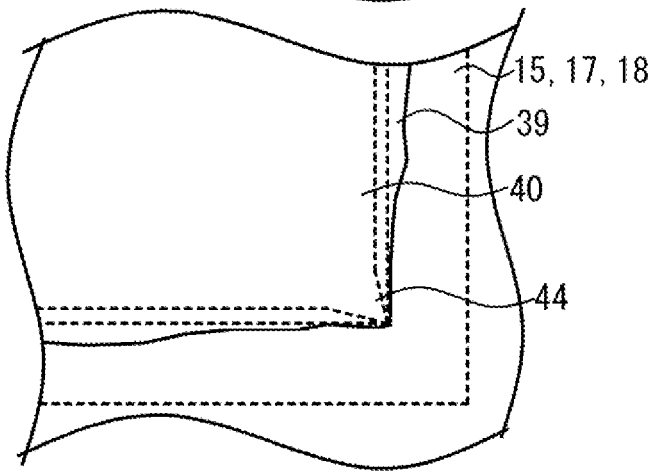
Figure 13C:
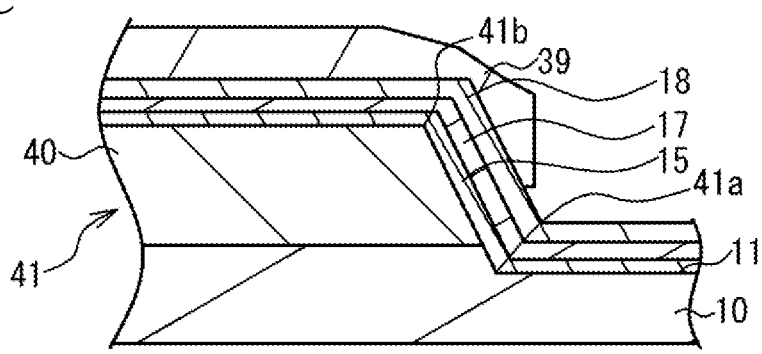
FIGS. 13C and 13D are enlarged cross-sectional views of the vicinity of the groove.

Next, a comparative example will be described. FIGS. 13A and 13B are enlarged plan views of the vicinity of the groove 11, and FIGS. 13C and 13B are enlarged cross-sectional views of the vicinity of the groove 11. In the comparative example, the vertices of the photoresist used for forming the mesa 41 are not chamfered, and the vertices form a sharp corner after heat shrinkage of the photoresist. Therefore, as shown in FIG. 13A, sharp vertices 44 are formed in the mesa 41.

Figure 13D:
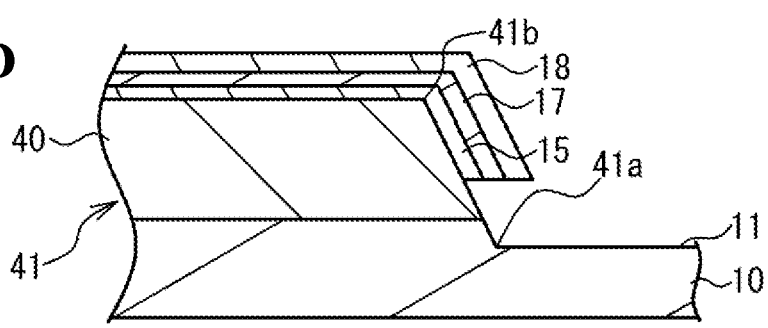

As shown in FIG. 13C, the side surfaces of the mesa 41 are inclined, and the photoresist 39 tends to be thinner on the side surfaces. As shown in FIG. 13B, particularly around the vertices 44, the photoresist 39 has poor coverage and is thinner. A defect occurs in the photoresist 39. As shown in FIG. 13D, the insulating films 15, 17, and 18 are simultaneously etched. Since there is a defect in the photoresist 39, the side etching of the insulating films 15, 17, and 18 proceeds, and a defect is formed. As a result, the semiconductor stack 40 is exposed, and the moisture resistance is lowered. In particular, since the insulating films 15 and 17 are formed of SiON or SiO$_2$, which are more hydrophilic than the insulating film 18, moisture easily enters through these films when they are exposed, and the semiconductor stack 40 is oxidized. The semiconductor stack 40 may also be degraded by dust or the like.

According to the first embodiment, the vertices of the mesa 41 of the semiconductor stack 40 have the chamfered portions 42. As a result, the coverage of the photoresists 38 and 39 is improved. Therefore, the insulating films 15, 17, and 18 cover the semiconductor stack 40 and extend to the outside of the mesa 41. Therefore, the moisture resistance can be improved.

The radius of curvature R of the chamfered portions 42 shown in FIG. 2A is preferably 10 µm or more and 20 µm or less. The coverage of the photoresist 39 is improved, and it is possible to provide the insulating film 18 extending outside the mesa 41 shown in FIG. 12C. Therefore, the moisture resistance can be improved. The radius of curvature R may be, for example, 5 µm or more, or 12 µm or more, and 18 µm or less, or 25 µm or less. The planar shape of the mesa 41 is a rectangle, but may be a polygon such as a pentagon, for example. Since each vertex has the chamfered portion 42, it does not form a sharp corner. The chamfered portions 42 may have a curved shape as shown in FIG. 1A, or may have, for example, a shape in which the vertex is cut linearly. The length of the chamfered portions 42 is smaller than that of the sides of the mesa 41.

As shown in FIGS. 11A to 12C, after the insulating films 15 and 17 are etched, the insulating film 18 and the photoresist 39 are provided, and the insulating film 18 is etched. As shown in FIG. 12B, since the photoresist 39 can be provided over the region from above the mesa 41 to the outside of the end 17a, the coverage of the photoresist 39 is improved. A defect is less likely to occur in the insulating film 18, and the moisture resistance is improved.

As shown in FIG. 9C and FIG. 11D, the end 15a of the insulating film 15 and the end 17a of the insulating film 17 are located between the lower end 41a of the mesa 41 and the end of the substrate 10, and the end 18a of the insulating film 18 is located between the end 15a of the insulating film 15 and the end 17a of the insulating film 17 and the end of the substrate 10. That is, two steps are formed over the region from the semiconductor stack 40 to the substrate 10, and the insulating film 18 extends over these steps. Since the semiconductor stack 40 and the insulating films 15 and 17 are not exposed from the insulating film 18, the moisture resistance can be improved.

The distance D1 between the lower end 41a and the end 17a shown in FIG. 2A is, for example, 2.5 µm or more, and the distance D2 between the end 17a and the end 18a is, for example, 1 µm or more. The photoresists 38 and 39 become thick, and a defect is less likely to occur in the insulating films 15, 17, and 18. The insulating film 18 extends from the lower end 41a to the end 18a and covers the semiconductor stack 40 and the insulating films 15 and 17. As a result, the moisture resistance is improved. The distance D1 is, for example, larger than the distance D2, and may be, for example, 2 µm or more, or 3 µm or more. The distance D2 may be, for example, 0.5 µm or more, or 1.5 µm or more.

The insulating films 15 and 17 are films containing oxygen (O), such as SiON or SiO$_2$, and have a low dielectric constant, so that the parasitic capacitance can be reduced. On the other hand, these films have higher hydrophilicity than SiN or the like. The insulating film 18 is, for example, a SiN film, which is denser and more hydrophobic than the insulating films 15 and 17. Since the insulating film 18 covers the insulating films 15 and 17, the moisture resistance is improved. The etching rate of the insulating films 15 and 17 is higher than that of the insulating film 18. Since the insulating film 18 covers the side surfaces of the insulating films 15 and 17 as shown in FIG. 12C, side etching is suppressed. The materials of the insulating films 15, 17, and 18 are not limited to the above. In order to reduce the parasitic capacitance, it is preferable that the insulating films 15 and 17 have a low dielectric constant. On the other hand, the insulating film 18 preferably has higher moisture resistance than the insulating films 15 and 17.

As shown in FIG. 8A, the side surfaces of the mesa 41 are inclined with respect to the stacking direction. The angle θ between the mesa 41 and the substrate 10 is, for example, 60° to 80°, and the height is, for example, 7 μm. By covering the mesa 41 with a thick photoresist 39 having a thickness of, for example, 3.5 μm or more, side etching of the insulating film 18 can be suppressed, and the moisture resistance can be enhanced. The angle θ may be 50° or more, 80° or more, or 90°, for example.

After the etching of the insulating film 18, a part of the substrate 10 is exposed in the groove 11, and the substrate 10 is cut at that part. Since the contact between the insulating films 15, 17, and 18 and the blade is suppressed, the insulating films 15, 17, and 18 are less likely to peel off, and the moisture resistance is improved.

Although the embodiments of the present invention have been described above in detail, the present invention is not limited to the specific embodiments, and various modifications and variations are possible within the scope of the gist of the present invention described in the claims.

What is claimed is:

1. A surface-emitting laser comprising:
   a substrate;
   a mesa of semiconductor layers disposed on the substrate, the mesa having polygonal shape in a direction in which the substrate extends, the semiconductor layers including:
   a lower reflector layer;
   an active layer; and
   an upper reflector layer;
   a vertex of the mesa in the direction in which the substrate extends, the vertex having a chamfered portion;
   a first insulating film covering the mesa, the first insulating film having an end located between an end of the mesa and an end of the substrate; and
   a second insulating film covering the first insulating film and the end of the first insulating film, the second insulating film having an end located between the end of the first insulating film and the end of the substrate,
   wherein a distance between the end of the mesa and the end of the first insulating film is 2.5 μm or more, and
   a distance between the end of the first insulating film and the end of the second insulating film is 1 μm or more.

2. The surface-emitting laser according to claim 1, wherein the chamfered portion is curved with a radius of curvature of 10 μm or more and 20 μm or less.

3. The surface-emitting laser according to claim 1, wherein
   the first insulating film includes silicon and oxygen, and
   the second insulating film includes silicon nitride.

4. The surface-emitting laser according to claim 1, wherein a side surface of the mesa is inclined with respect to a stacking direction of the semiconductor layers.

* * * * *